(12) United States Patent
Moon et al.

(10) Patent No.: US 11,706,976 B2
(45) Date of Patent: Jul. 18, 2023

(54) ORGANIC ELECTROLUMINESCENT DEVICE CONTAINING EXCITON CONFINEMENT LAYER

(71) Applicant: SOLUS ADVANCED MATERIALS CO., LTD., Iksan-si (KR)

(72) Inventors: Jonghun Moon, Yongin-si (KR); Taehyung Kim, Yongin-si (KR); Hocheol Park, Yongin-si (KR); Songie Han, Yongin-si (KR)

(73) Assignee: SOLUS ADVANCED MATERIALS CO., LTD., Iksan-si (KR)

( * ) Notice: Subject to any disclaimer, the term of this patent is extended or adjusted under 35 U.S.C. 154(b) by 273 days.

(21) Appl. No.: 16/759,468

(22) PCT Filed: Feb. 18, 2020

(86) PCT No.: PCT/KR2020/002339
§ 371 (c)(1),
(2) Date: Apr. 27, 2020

(87) PCT Pub. No.: WO2021/132800
PCT Pub. Date: Jul. 1, 2021

(65) Prior Publication Data
US 2022/0006021 A1    Jan. 6, 2022

(30) Foreign Application Priority Data
Dec. 24, 2019  (KR) .................. 10-2019-0174501

(51) Int. Cl.
*H10K 85/60* (2023.01)
*H10K 71/16* (2023.01)
(Continued)

(52) U.S. Cl.
CPC ........ *H01L 51/0067* (2013.01); *H01L 51/001* (2013.01); *H01L 51/0054* (2013.01);
(Continued)

(58) Field of Classification Search
CPC ............... H01L 51/0067; H01L 51/001; H01L 51/0054; H01L 51/0058; H01L 51/0072; H01L 51/0073
(Continued)

(56) References Cited

U.S. PATENT DOCUMENTS 8,829,504 B2    9/2014  Song et al.
8,884,274 B2   11/2014  Han et al.
(Continued)

FOREIGN PATENT DOCUMENTS

CN    107108504 B    12/2020
CN    107108529 B     8/2021
(Continued)

OTHER PUBLICATIONS

"Excitonic characteristics of blue-emitting quantum dot materials in group II-VI using hybrid time-dependent density functional theory" Physical Review B104, 045404 (2021) by Han et. al.*
(Continued)

*Primary Examiner* — Sheng-Bai Zhu
(74) *Attorney, Agent, or Firm* — Sughrue Mion, PLLC

(57) ABSTRACT

An organic electroluminescent device is disclosed. The organic electroluminescent device achieves low driving voltage and high luminous efficiency as well as long lifespan by including an exciton confinement layer (ECL), in which a predetermined physical property is adjusted, in an area of an electron transporting area, including at least two layers, that is adjacent to an emissive layer.

19 Claims, 1 Drawing Sheet

(51) Int. Cl.
*H10K 50/11* (2023.01)
*H10K 50/13* (2023.01)
*H10K 71/00* (2023.01)
*H01L 51/00* (2006.01)
*H01L 51/50* (2006.01)
*H01L 51/56* (2006.01)

(52) U.S. Cl.
CPC ...... *H01L 51/0058* (2013.01); *H01L 51/0072* (2013.01); *H01L 51/0073* (2013.01); *H01L 51/5004* (2013.01); *H01L 51/504* (2013.01); *H01L 51/5016* (2013.01); *H01L 51/56* (2013.01)

(58) Field of Classification Search
USPC .......................................................... 257/40
See application file for complete search history.

(56) References Cited

U.S. PATENT DOCUMENTS

| 10,916,709 | B2 | 2/2021 | Eum et al. |
| 2017/0179418 | A1 | 6/2017 | Lee |
| 2019/0189947 | A1 | 6/2019 | Shin et al. |
| 2020/0185617 | A1 | 6/2020 | Eum et al. |

FOREIGN PATENT DOCUMENTS

| KR | 10-2010-0073417 A | 7/2010 |
| KR | 10-2012-0004018 A | 1/2012 |
| KR | 10-2013-0031160 A | 3/2013 |
| KR | 10-2013-0039671 A | 4/2013 |
| KR | 10-2019-0073631 A | 6/2019 |
| WO | 2016/105141 A2 | 6/2016 |

OTHER PUBLICATIONS

"Triplet exciton confinement in phosphorrescent polymer light-emitting diodes" Applied Physics Letters vol. 82, No. 7 (2003) by Chen et. al.*

"Triplet exciton confinement in green organic light-emitting diodes containing luminescent charge-transfer Cu(I) complexes" Adv. Funct. Mater. 2012, 22, 2327-2336 by Zhang et. al.*

International Search Report in International Application No. PCT/KR2020/002339, dated Sep. 18, 2020.

Korea Intellectual Property Office, Correspondence in Application No. 10-2019-0174501 dated Feb. 28, 2020.

\* cited by examiner

[FIG. 1]
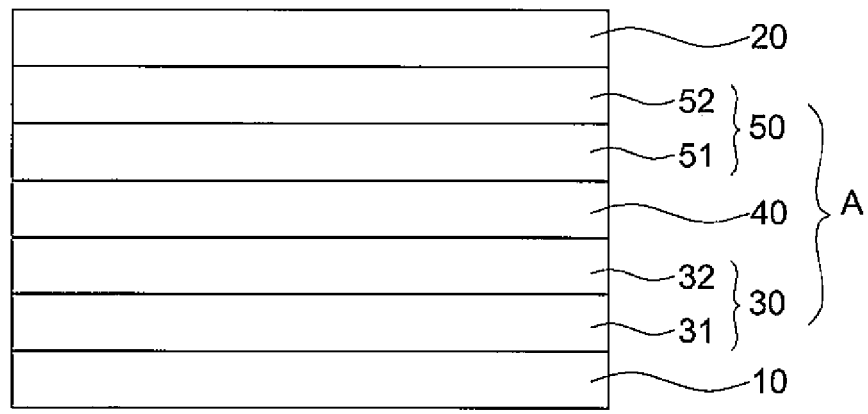
[FIG. 2]
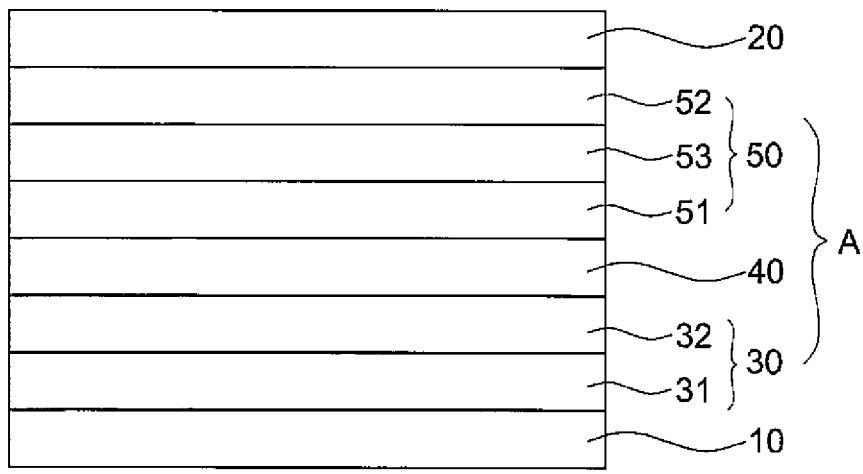

ORGANIC ELECTROLUMINESCENT DEVICE CONTAINING EXCITON CONFINEMENT LAYER

CROSS REFERENCE TO RELATED APPLICATIONS

This application is a National Stage of International Application No. PCT/KR2020/002339, filed Feb. 18, 2020, claiming priority to Korean Patent Application No. 10-2019-0174501, filed Dec. 24, 2019.

TECHNICAL FIELD

The present invention relates to an organic electroluminescent device improved in terms of low driving voltage, high luminous efficiency, and long lifespan by including an exciton confinement layer, in which a predetermined physical property is adjusted, in an area of an electron transporting area, including at least two layers, that is adjacent to an emissive layer.

DISCUSSION OF RELATED ART

In 1965, studies on organic electroluminescent devices (hereinafter, "organic EL devices") led to blue electroluminescence which uses anthracene monocrystals, and in 1987, Tang suggested an organic EL device in a two-layered stack structure which includes a hole layer (NPB) and an emissive layer (Alq$_3$). Afterwards, in order to realize high efficiency and long life characteristics required for commercialization of organic EL devices, a multilayer stack structure that includes, for example, organic material layers responsible for hole injection and transporting, organic material layers responsible for electron injection and transporting, and an organic material layer responsible for inducing combination of the holes and electrons to cause electroluminescence, each having distinctive and subdivided functions, has been suggested. The introduction of the multilayer stack structure improved the performance of the organic EL devices up to the level of commercialization, and such a multilayer stack structure has been expanding its application range from portable radio display products in 1997 to portable information display devices and TV display devices.

The demand for larger displays and higher resolutions has led to challenges, for example, high efficiency and long lifespan, for the organic EL devices. Particularly, the high resolution that may be realized by forming more pixels in the same area results in a decrease in a light emitting area of an organic EL pixel, thus inevitably reducing the lifetime, which has become one of the most important technical problems to be overcome for the organic EL device.

In the organic EL device, when current or voltage is applied to two electrodes, holes are injected into an organic material layer at an anode, and electrons are injected into the organic material layer at a cathode. When the injected holes and electrons meet, an exciton is formed, and the exciton falls to the ground state, resulting in light emission. Such organic EL devices may be classified, according to an electron spin type of the formed excitons, into fluorescent electroluminescent devices in which singlet excitons contribute to light emission and phosphorescent electroluminescent devices in which triplet excitons contribute to light emission.

In terms of the electron spin of the excitons that are formed by recombination of electrons and holes, 25% of singlet excitons and 75% of triplet excitons are produced. In the fluorescent electroluminescent devices which emit light by singlet excitons, the internal quantum efficiency may not theoretically exceed 25% depending on the production ratio, and the external quantum efficiency is regarded to have a limitation of 5%. The phosphorescent electroluminescent devices which emit light by triplet excitons may improve luminous efficiency by up to four times compared to fluorescence, when metal complex compounds containing transition metal heavy atoms such as Ir and Pt are used as phosphorescent dopants.

As described above, although the phosphorescent electroluminescent devices exhibit higher efficiency than fluorescence in terms of luminous efficiency based on the theoretical fact, in the case of blue phosphorescent devices, except green and red, the development level for phosphorescent dopants having deep blue color purity and high efficiency and hosts having a broad energy gap to satisfy such phosphorescent dopants is insufficient, and thus blue phosphorescent devices have not been commercialized yet, and blue fluorescent devices have been used in products.

In order to improve such characteristics of the organic EL device, research results to increase the stability of the organic EL device by preventing diffusion of holes into an electron transferring layer have been reported. However, to date, no satisfactory result has been obtained.

DETAILED DESCRIPTION OF THE INVENTION

Technical Objectives

The present invention is directed to an organic EL device that achieves low driving voltage and high luminous efficiency as well as long lifespan by including an exciton confinement layer (ECL), in which a predetermined physical property such as density of states (DOS) is adjusted, in an area of an electron transporting area, including at least two layers, that is adjacent to an emissive layer.

Other objectives and advantages of the present invention can be more clearly described by the following detailed description and claims.

Technical Solution to the Problem

In order to achieve the above objectives, the present invention provides an organic electroluminescent device that comprises a structure in which an anode; a hole transporting area; an emissive layer; an electron transporting area, and a cathode are sequentially stacked, where the emissive layer comprises a host, the electron transporting area includes at least two layers, one of the at least two layers that is in contact with the emissive layer is an exciton confinement layer, and a density of states for LUMO (DOS$_{LUMO}^{ECL}$) of the exciton confinement layer satisfies at least one or more of the following conditions (i) and (ii):

(i) the density of states for LUMO (DOS$_{LUMO}^{ECL}$) of the exciton confinement layer having a DOS that overlaps more than 0% of a density of states for LUMO (DOS$_{LUMO}^{HOST}$) of the host; and (ii) the density of states for LUMO (DOS$_{LUMO}^{ECL}$) of the exciton confinement layer having a DOS that overlaps more than 0% of a density of states for LUMO (DOS$_{LUMO}^{ET}$) of the remaining layer of the electron transporting area except the exciton confinement layer.

According to an embodiment, the electron transporting area may comprise at least one of an exciton confinement layer, an electron transporting layer and an electron injection layer.

According to an embodiment, with respect to the emissive layer, the electron transporting area may have a structure in which the exciton confinement layer, and the electron injection layer are disposed, or a structure in which the exciton confinement layer, the electron transporting layer and the electron injection layer are disposed.

According to an embodiment, a triplet energy ($T1_{ECL}$) of the exciton confinement layer may be 1.5 eV or more.

According to an embodiment, a singlet energy ($S1_{ECL}$) of the exciton confinement layer may be 2.0 eV or more.

According to an embodiment, an absolute value of HOMO of the exciton confinement layer may be 5.0 eV or more.

According to an embodiment, a band gap energy of the exciton confinement layer may be 2.0 eV or more.

According to an embodiment, the exciton confinement layer may have a lowest energy level of bond-dissociation energy (BDE) in a ground state of 1.50 eV or more.

According to an embodiment, an absolute value difference (ΔLUMO) between a LUMO energy level of the exciton confinement layer and a LUMO energy level of the host may be 2.0 eV or less.

According to an embodiment, an absolute value difference (ΔLUMO) between a LUMO energy level of the exciton confinement layer and a LUMO energy level of another layer of the electron transporting area that is adjacent to the exciton confinement layer may be 2.0 eV or less.

According to an embodiment, an absolute value difference (ΔHOMO) between a HOMO energy level of the exciton confinement layer and a HOMO energy level of the host may be 2.0 eV or less.

According to an embodiment, an absolute value difference (ΔHOMO) between a HOMO energy level of the exciton confinement layer and a HOMO energy level of another layer of the electron transporting area that is adjacent to the exciton confinement layer may be 2.0 eV or less.

According to an embodiment, an electronic affinity (EA) of the exciton confinement layer may be 0.5 eV or more.

According to an embodiment, the exciton confinement layer may have a refractive index (n) of 0.7 or more in a blue wavelength region ranging from 400 to 470 nm.

According to an embodiment, a dipole moment of the exciton confinement layer may be greater than zero.

According to an embodiment, the exciton confinement layer may have an electron mobility (μ) of at least $1 \times 10^{-8}$ cm$^2$/Vs or more.

According to an embodiment, the emissive layer may include a host and a dopant, and a mixing ratio of the host and dopant is 70-99.5:0.5-30 in a weight ratio.

According to an embodiment, the organic electroluminescent device may include a plurality of emissive layer stacks including at least one emissive layer.

Effects of the Invention

According to an embodiment of the present invention, an organic EL device that has low driving voltage and high luminous efficiency may be provided by adopting a material whose, for example, a density of the states (DOS) is adjusted within a predetermined range and disposing the material in an area of an electron transporting area, including at least two layers, that is adjacent to an emissive layer.

The effects of the present invention are not limited by the descriptions exemplified above, and more various effects are involved herein.

BRIEF DESCRIPTION OF DRAWINGS

FIG. 1 is a cross-sectional view illustrating a structure of an organic EL device according to an embodiment of the present invention.

FIG. 2 is a cross-sectional view illustrating a structure of an organic EL device according to another embodiment of the present invention.

DESCRIPTION OF MAIN REFERENCE NUMERALS OF DRAWINGS

100: an organic electroluminescence device
A: an organic material layer
10: an anode
20: a cathode
30: a hole transporting area
31: a hole injection layer
32: a hole transporting layer
40: an emissive layer (a light-emitting layer)
50: an electron transporting area
51: an exciton confinement layer
52: an electron injection layer
53: an electron transporting layer

MODES FOR CARRYING OUT THE INVENTION

Advantages and features of the present invention and methods for achieving them will become apparent with reference to the embodiments described below in detail in conjunction with the accompanying drawings. However, the present invention is not limited to the embodiments disclosed below but may be implemented in various different forms, the present embodiments are merely provided to make the disclosure of the present invention complete and to fully convey the scope of the present invention to those of ordinary skill in the art, and the present invention is defined only by the scope of the claims. Thus, in some embodiments, well-known process steps, well-known device structures and well-known techniques are not described in detail in order to avoid obscuring the present invention. Like reference numerals refer to like elements throughout the specification.

Unless otherwise defined, all terms used in the present specification (including technical and scientific terms) may be used with meanings that can be commonly understood by those skilled in the art. In addition, the terms defined in the commonly used dictionaries are not ideally or excessively interpreted, unless they are specifically defined clearly.

In addition, throughout the specification, when a part is said to "include" an element, it means that it may further include another element, not excluding other elements, unless otherwise stated. In addition, throughout the specification, "above" or "on" means not only the case where it is located above or below a target part but also the case where there is another part in the middle thereof and does not necessarily mean the upward direction of gravity. As used herein, the terms "first", "second", and the like are used to distinguish elements from each other, rather than indicating any order or importance.

<Organic EL Device>

An organic EL device according to an embodiment of the present invention includes an anode, a cathode disposed opposite the anode, and one or more organic material layers between the anode and the cathode, the one or more organic material layers including a hole transporting area, an emissive layer and an electron transporting area, and an exciton confinement layer (ECL) in which a certain physical property such as density of states (DOS) is adjusted within a predetermined range is disposed in an area of the electron transporting area in contact with the emissive layer.

Hereinafter, preferred embodiments of the organic EL device according to the present invention will be described with reference to the accompanying drawings. However, embodiments of the present invention may be modified in various other forms, and the scope of the present invention is not limited to the embodiments described below.

FIG. 1 is a cross-sectional view illustrating a structure of an organic EL device 100 according to a first embodiment of the present invention.

Referring to FIG. 1, an organic EL device 100 includes an anode 10, a cathode 20, an emissive layer 40 located between the anode 10 and the cathode 20, a hole transporting area 30 located between the anode 10 and the emissive layer 40, and an electron transporting area 50 located between the emissive layer 40 and the cathode 20, where the electron transporting area 50 includes at least two layers, and an exciton confinement layer 51 is disposed at one of the at least two layers 51 and 52 in contact with the emissive layer 40.

The electron transporting area 50 including at least two layers may include at least one of the exciton confinement layer 51, an electron transporting layer, and an electron injection layer 52.

Anode

In the organic EL device 100 according to the present invention, the anode 10 serves to inject holes into an organic material layer A.

A material forming the anode 10 is not particularly limited, and conventional materials known in the art may be used. Non-limiting examples thereof may include metals such as vanadium, chromium, copper, zinc and gold, alloys thereof, metal oxides such as zinc oxide, indium oxide, indium tin oxide (ITO) and indium zinc oxide (IZO), a combination of a metal and an oxide such as ZnO:Al and $SnO_2$:Sb, conductive polymers such as polythiophene, poly(3-methylthiophene), poly[3,4-(ethylene-1,2-dioxy)thiophene](PEDT), polypyrrole and polyaniline, and carbon black.

A method of manufacturing the anode 10 is also not particularly limited and it may be prepared according to conventional methods known in the art. As an example, a method of coating an anode material on a substrate formed of a silicon wafer, quartz, a glass plate, a metal plate or a plastic film may be used.

Cathode

In the organic EL device 100 according to the present invention, the cathode 20 serves to inject electrons into the organic material layer A.

A material forming the cathode 20 is not particularly limited, and conventional materials known in the art may be used. Non-limiting examples thereof may include metals such as magnesium, calcium, sodium, potassium, titanium, indium, yttrium, lithium, gadolinium, aluminum, silver, tin, and lead, alloys thereof, and multilayer-structured materials such as LiF/Al and $LiO_2$/Al.

In addition, a method of manufacturing the cathode 20 is not also particularly limited and it may be prepared according to conventional methods known in the art.

Organic Material Layer

The organic material layer A included in the organic EL device according to the present invention may use, without limitation, any conventional configuration used in an organic material layer of conventional organic EL devices, and may include, for example, one or more selected from the hole transporting area 30, the emissive layer 40, and the electron transporting area 50. In such a case, in consideration of the characteristics of the organic EL device, it is preferable to include all the above-mentioned organic material layers.

Hole Transporting Area

The hole transporting area 30 included in the organic material layer A of the present invention serves to move the holes injected from the anode 10 to the emissive layer 40. The hole transporting area 30 may include one or more selected from the group consisting of a hole injection layer 31 and a hole transporting layer 32. In such a case, in consideration of the characteristics of the organic EL device, it is preferable to include both the hole injection layer 31 and the hole transporting layer 32 described above.

Materials forming the hole injection layer 31 and the hole transporting layer 32 are not particularly limited, and any hole injection/transporting layer material known in the art may be used without limitation, as long as it has a low hole injection barrier and a high hole mobility. In such a case, the materials forming the hole injection layer 31 and the hole transporting layer 32 may be the same as or different from each other.

The hole injection material may use, without limitation, a hole injection material known in the art. Non-limiting examples of the hole injection material may include phthalocyanine compounds such as copper phthalocyanine; DNTPD (N,N'-diphenyl-N,N'-bis-[4-(phenyl-m-tolyl-amino)-phenyl]-biphenyl-4,4'-diamine), m-MTDATA (4,4',4"-tris(3-methylphenylphenylamino)triphenylamine), TDATA (4,4'4"-Tris(N,N-diphenylamino)triphenylamine), 2TNATA (4,4',4"-tris(N-(2-naphthyl)-N-phenylamino)-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/camphor sulfonic acid), PANI/PSS (polyaniline)/poly(4-styrenesulfonate)), and the like, which may be used solely or as a mixture of two or more thereof.

The hole transporting material may use, without limitation, a hole transporting material known in the art. Non-limiting examples of the hole transporting material may include carbazole-based derivatives such as phenylcarbazole, polyvinylcarbazole or the like; fluorine-based derivatives; triphenylamine-based derivatives such as TPD (N,N'-bis(3-methylphenyl)-N,N'-diphenyl-[1,1-biphenyl]-4,4'-diamine), TCTA (4,4',4"-tris(N-carbazolyl)triphenylamine) or the like; NPB (N,N'-di(1-naphthyl)-N,N'-diphenylbenzidine), TAPC(4,4'-cyclohexylidene bis[N,N-bis(4-methylphenyl)benzenamine]), and the like. They may be used solely or as a mixture of two or more thereof.

The hole transporting area 30 may be formed through any conventional method known in the art. Examples of the method may include, but are not limited to, a vacuum deposition method, a spin coating method, a cast method, a Langmuir-Blodgett (LB) method, an inkjet printing method, a laser printing method, a laser-induced thermal imaging (LITI) method, and the like.

Emissive Layer

The emissive layer 40 included in the organic material layer A of the present invention is a layer in which holes and electrons meet to form excitons, and the color of light emitted by the organic EL device may vary depending on the material forming the emissive layer 40.

Such an emissive layer 40 may include a host and a dopant, and a mixing rate thereof may be appropriately adjusted within a range known in the art. For example, the host may be included in a range of 70 to 99.9 percent by weight (hereinafter, "wt %"), and the dopant may be included in a range of 0.1 to 30 wt %. More specifically, when the emissive layer 40 is blue fluorescence, green fluorescence, or red fluorescence, the host may be included in a range of 80 to 99.9 wt %, and the dopant may be included in a range of 0.1 to 20 wt %. In addition, when the emissive layer 40 is blue fluorescence, green fluorescence or red phosphorescence, the host may be included in a range of 70 to 99 wt % and the dopant may be included in a range of 1 to 30 wt %.

The host included in the emissive layer 40 of the present invention is not particularly limited as long as it is known in the art, and non-limiting examples thereof may include alkali metal complex compounds, alkaline earth metal complex compounds, or condensed aromatic cyclic derivatives.

More specifically, the host material is preferably aluminum complex compounds, beryllium complex compounds, anthracene derivatives, pyrene derivatives, triphenylene derivatives, carbazole derivatives, dibenzofuran derivatives, dibenzothiophene derivatives, or a combination of one or more kinds thereof that may enhance luminous efficiency and lifespan.

In addition, the dopant included in the emissive layer 40 of the present invention is not particularly limited as long as it is known in the art, and non-limiting examples thereof may include anthracene derivatives, pyrene derivatives, arylamine derivatives, and metal complex compounds including iridium (Ir) or platinum (Pt).

Such dopants may be classified into red dopants, green dopants, and blue dopants. Conventional red dopants, green dopants, and blue dopants that are known in the art may be used without particular limitation.

More specifically, non-limiting examples of the red dopant may include PtOEP (Pt(II) octaethylporphyrin), Ir(piq)$_3$ (tris(2-phenylisoquinoline)iridium), Btp$_2$Ir(acac) (bis(2-(2'-benzothienyl)-pyridinato-N,C3')iridium(acetylacetonate)), or a mixture of two or more thereof.

Furthermore, non-limiting examples of the green dopant may include Ir(ppy)$_3$ (tris(2-phenylpyridine)iridium), Ir(ppy)$_2$(acac) (bis(2-phenylpyridinexacetylacetonato)iridium (III)), Ir(mppy)$_3$ (tris(2-(4-tolyl)phenylpiridine)iridium), C545T (10-(2-benzothiazolyl)-1,1,7,7-tetramethyl-2,3,6,7-tetrahydro-1H,5H,11H-[1]benzopyrano[6,7,8-ij]-quinolizin-11-one), or a mixture of two or more thereof.

Furthermore, non-limiting examples of the blue dopant may include F$_2$Irpic (bis[3,5-difluoro-2-(2-pyridyl)phenyl] (picolinato)iridium(III)), (F$_2$ppy)$_2$Ir(tmd), Ir(dfppz)$_3$, DP-VBi (4,4'-bis(2,2'-diphenylethen-1-yl)biphenyl), DPAVBi (4,4'-bis[4-(diphenylamino)styryl]biphenyl), TBPe (2,5,8, 11-tetra-tert-butylperylene), or a mixture of two or more thereof.

The emissive layer 40 according to the present invention may be a red emissive layer including a red phosphorescent material, a green emissive layer including a green phosphorescent material; or a blue emissive layer including a blue phosphorescent material or a blue fluorescent material. The emissive layer 40 may preferably bean emissive layer including a blue fluorescent material.

The emissive layer 40 may include a single layer including one type of material, a single layer including a plurality of different materials, or a multi-layer of at least two layers, each including different materials from each other. When the emissive layer 40 includes a plurality of layers, the organic EL device may emit light having various colors. Specifically, the present invention may provide an organic EL device having mixed colors by including a plurality of emissive layers including different kinds of materials in series. In addition, when the emissive layer 40 includes a plurality of emissive layers, the driving voltage of the device may increase, while the current value in the organic EL device become constant, and thus the organic EL device may have luminous efficiency that is improved by the number of the emissive layers.

Although not illustrated in the drawings, the organic EL device 100 may include a plurality of light emission stacks (not illustrated) including at least one emissive layer.

The plurality of emissive layers included in the light emission stack may be emissive layers that emit light of different colors, or emissive layers that emit light of the same color. That is, the emission color may vary depending on the material forming the emissive layer. For example, the plurality of light emission stacks may include a material emitting blue, green, red, yellow, white, or the like, and may be formed using phosphorescent or fluorescent materials. In this case, the colors represented by the emissive layers may be complementary to each other. In addition, a color may be selected as a combination of colors capable of emitting white light. Each of the emissive layers may include phosphorescent dopants or fluorescent dopants corresponding to the selected color, respectively.

Although not illustrated in the drawings, the organic EL device 100 may further include a charge generation layer (CGL)(not illustrated) disposed between adjacent stacks of the plurality of light emission stacks and connecting them.

The charge generation layer means a layer, in the organic EL device including a plurality of light emission stacks, that separates light emission stacks adjacent to each other without directly contacting both electrodes (e.g., the anode and the cathode). Such a charge generation layer is disposed between two adjacent light emission stacks, generating electrons to serve as a cathode for one light emission stack, and generating holes to serve as an anode for another light emission stack. The charge generation layer may use, without limitation, any material that can be used as a charge generation layer material known in the art. In addition, a conventional n-type and/or p-type material known in the art may be doped to the above material for the charge generation layer.

Electron Transporting Area

In the organic EL device 100 according to the present invention, the electron transporting area 50 included in the organic material layer A serves to move electrons injected from the cathode 20 to the emissive layer 40.

The electron transporting area 50 may include two or more layers including at least one of the exciton confinement layer 51, the electron transporting layer 53 and the electron injection layer 52, and may further include an auxiliary electron transporting layer (not illustrated) as necessary.

In the present invention, the exciton confinement layer (ECL) 51 in which a predetermined physical property (for example, DOS overlap rate) is adjusted to a predetermined range is disposed in an area of the electron transporting area 50 in contact with the emissive layer 40 of the at least two layers.

The exciton confinement layer 51 has a density of states (DOS) that partially overlaps a DOS of at least one of materials of two adjacent layers, e.g., a host material of the emissive layer 40 and the remaining layer of the at least two layers of the electron transporting area, e.g., the electron transporting layer 53 and the electron injection layer 52.

As used herein, the density of states (DOS) may be defined as the number of electronic states allowed to occupy at a specific energy level, and based on this, a DOS for LUMO is investigated using a computer simulation-deposition method.

In an embodiment, the density of states for LUMO ($DOS_{LUMO}^{ECL}$) of the exciton confinement layer 51 may satisfy at least one or more of the following conditions (i) and (ii):

(i) the density of states for LUMO ($DOS_{LUMO}^{ECL}$) of the exciton confinement layer having a DOS that overlaps more than 0% of a density of states for LUMO ($DOS_{LUMO}^{HOST}$) of the host; and (ii) the density of states for LUMO ($DOS_{LUMO}^{ECL}$) of the exciton confinement layer having a DOS that overlaps more than 0% of a density of states for LUMO ($DOS_{LUMO}^{ET}$) of the remaining layer of the two layers of the electron transporting area except the exciton confinement layer.

As an example, the density of states for LUMO ($DOS_{LUMO}^{ECL}$) of the exciton confinement layer 51 may have a DOS that overlaps more than 0% of the density of states for LUMO ($DOS_{LUMO}^{HOST}$) of the host.

As another example, the density of states for LUMO ($DOS_{LUMO}^{ECL}$) of the exciton confinement layer ECL may have a DOS that overlaps more than 0% of a density of states for LUMO ($DOS_{LUMO}^{ET}$) of the remaining layer of the electron transporting area 50 except the exciton confinement layer ECL.

As another example, the density of states for LUMO ($DOS_{LUMO}^{ECL}$) of the exciton confinement layer ECL may have a DOS that overlaps more than 0% of at least one of a density of states for LUMO ($DOS_{LUMO}^{HOST}$) of the host and a density of states for LUMO ($DOS_{LUMO}^{ET}$) of the remaining layer of the electron transporting area 50 except the exciton confinement layer ECL.

As another example, the density of states for LUMO ($DOS_{LUMO}^{ECL}$) of the exciton confinement layer ECL may have a DOS that overlaps more than 0% of both of a density of states for LUMO ($DOS_{LUMO}^{HOST}$) of the host and a density of states for LUMO ($DOS_{LUMO}^{ET}$) of the remaining layer of the electron transporting area 50 except the exciton confinement layer ECL.

In such a case, when the layer forming the remaining electron transporting area except the exciton confinement layer ECL in the electron transporting area 50 has a multilayer structure, the electron transporting area 50 having a DOS that overlaps that of the exciton confinement layer 51 may mean an area of the electron transporting area 50 adjacent to the exciton confinement layer ECL, specifically, a layer in contact with the exciton confinement layer ECL, for example, the electron injection layer 52 and/or the electron transporting layer 53.

As such, in a case where the DOS for LUMO of the exciton confinement layer 51 overlaps more than 0%, that is, at least part of a DOS of at least one of a DOS for LUMO of the host or a DOS for LUMO of a material of the layer (e.g., 52) of the electron transporting area 50 that is adjacent to the exciton confinement layer, electron movement from the host of the emissive layer 40 to the electron transporting area 50 is performed smoothly, thereby increasing the efficiency of the device. In particular, the above-described effect is more advantageous in terms of carrier mobility of the host, as the DOS overlap rate between the exciton confinement layer 51 and the host is higher, thereby capable of exhibiting a synergy effect. In addition, as the overlap rate between the exciton confinement layer 51 and the adjacent layer 52 in the electron transporting area increases, carrier movement in the electron transporting area may increase to show a synergy effect. Accordingly, it is preferable that the density of states for LUMO ($DOS_{LUMO}^{ECL}$) of the exciton confinement layer 51 has a DOS overlapping at least part of each of the density of states for LUMO ($DOS_{LUMO}^{HOST}$) of the host, and a density of states for LUMO ($DOS_{LUMO}^{ET}$) of the another layer 52 of the at least two layers of the electron transporting area except the exciton confinement layer 51. The LUMO DOS overlap rate between materials of the two layers adjacent to the exciton confinement layer 51, e.g., a host material and/or the other electron transporting area material is not particularly limited and may be appropriately adjusted considering the above-described carrier mobility. For example, it may be greater than 0%, specifically greater than 0% and 95% or less, and more specifically 1 to 85%.

The exciton confinement layer 51 may be a single layer or multilayer structure of two or more layers. When the exciton confinement layer 51 has a multilayer structure including two or more layers, it is preferable that one exciton confinement layer 51 of the multilayer structure, in which a DOS overlap rate and the like is adjusted is in direct contacts with the emissive layer 40 and/or the other electron transporting area 52.

The exciton confinement layer 51 according to the present invention may further satisfy at least one of the following physical properties in order to exhibit a low driving voltage and a high efficiency in addition to the carrier mobility enhancement effect due to the above-described DOS overlap.

In an embodiment, a singlet energy $S1_{ECL}$ of the exciton confinement layer 51 may be 2.0 eV or more, specifically 2.0 to 4.5 eV, and more specifically 2.5 to 4.0 eV. This prevents the singlet excitons from diffusing into adjacent interfaces and/or other layers or from causing light emission at the interfaces, thus effectively confining singlet excitons. Accordingly, an amount of excitons may be increased to improve the luminous efficiency of the organic EL device. Thus, it is possible to prevent spectral mixing of the organic EL device and to improve stability, thereby improving efficiency and lifespan of the organic EL device.

In another embodiment, a triplet energy ($T1_{ECL}$) of the exciton confinement layer 51 may be 1.5 eV or more, specifically 1.5 to 4.5 eV, and more specifically 2.0 to 4.0 eV. This prevents the excitons from moving to the remaining layer, thereby significantly increasing the efficiency of the organic EL device.

In another embodiment, an absolute value of a highest occupied molecular orbital (HOMO) of the exciton confinement layer 51 may be 5.0 or more, specifically 5.0 to 7.0 eV, more specifically 5.0 to 6.5 eV. When having such a HOMO energy value, it is possible to prevent the phenomenon that holes transferred to the emissive layer 40 from diffusing or crossing over to another electron transporting area, for example, the electron transporting layer 53. Accordingly, the luminous efficiency of the organic EL device may be further increased by increasing the probability of recombination of holes and electrons in the emissive layer 40. In addition, it is possible to improve the life characteristics of the device by solving the irreversible decomposition reaction caused by oxidation when the holes are diffused or move beyond the emissive layer 40 to the electron transporting layer 53, and to improve the life characteristics of the organic EL device. In addition, in order to efficiently obtain high efficiency, a band gap energy of the exciton confinement layer 51 may be 2.5 eV or more, and specifically, 2.5 to 4.5 eV.

In another embodiment, the exciton confinement layer 51 may have a lowest bond-dissociation energy (BDE) in a ground state of at least 1.50 eV or more, and specifically 1.5 to 6.0 eV. Herein, the BDE may be interpreted as an energy required to break a specific chemical bond. In general, BDE is related to the stability of the molecule as the bond is stronger, and also acts as a factor affecting the lifetime.

In another embodiment, an absolute value difference ΔLUMO between the LUMO energy level of the exciton confinement layer 51 and the respective LUMO energy levels of the two organic material layers adjacent to the exciton confinement layer 51, e.g., the host included in the emissive layer 40 or the adjacent layer 52 of the electron transporting area may be 2.0 eV or less, and specifically, greater than 0 to 2.0 eV.

In another embodiment, an absolute value difference ΔHOMO between the HOMO energy level of the exciton confinement layer 51 and the respective HOMO energy levels of the two organic material layers adjacent to the exciton confinement layer 51, e.g., the host included in the emissive layer 40 or the adjacent layer 52 of the electron transporting area may be 2.0 eV or less, and specifically, greater than 0 to 2.0 eV.

For example, the LUMO/HOMO energy level of the exciton confinement layer 51 according to the present invention may be adjusted to be between the two adjacent organic material layers, specifically, between the emissive layer 40 and the remaining layer 52 of the electron transporting area. For example, the HOMO energy level of the exciton confinement layer 51 may be deeper than the HOMO energy level of the emissive layer 40 and may be equal to or shallower than the HOMO energy level of the other adjacent layer 52 of the electron transporting area. When the above-described HOMO/LUMO energy levels are satisfied, the HOMO/LUMO energy levels of the emissive layer 40, the exciton confinement layer 51, and the electron transporting area may be arranged in a step-like manner. Accordingly, holes transferred through the anode 10 and electrons transferred through the cathode 20 are more smoothly transferred to the emissive layer 40 through the stepped arrangement of the organic material layer A, thereby increasing exciton formation and enhancing efficiency of the device.

In another embodiment, an electronic affinity (EA) of the exciton confinement layer 51 may be at least 0.5 eV or more, and specifically, 0.5 to 3.0 eV. When the exciton confinement layer 51 has the electronic affinity as described above, a high electron injection efficiency may be obtained.

In another embodiment, in a case where the emissive layer 40 is a blue emissive layer including a fluorescent blue luminous material, the exciton confinement layer 51 may have a refractive index n in a blue wavelength region of 400 to 470 nm of at least 0.7 or more, and specifically 0.7 to 3.5.

If the electrons and holes are not balanced due to a difference between the number of holes injected from the anode 10 and the number of electrons injected from the cathode 20, the electrons or holes that do not form excitons through recombination are accumulated in the emissive layer 40. The electrons or holes accumulated in the emissive layer 40 may hinder smooth oxidation and reduction in the emissive layer 40 or may affect adjacent layers to reduce the lifespan of the organic EL device. On the other hand, as the exciton confinement layer 51 has the electron mobility μ of at least 1×10$^{-8}$ cm$^2$/Vs or more at room temperature, the delay of injection of electrons relative to the number of holes injected from the anode 10 may be prevented, and the electrons are smoothly injected to the emissive layer 40 to increase the exciton forming efficiency in the emissive layer 40, thereby improving the lifespan of the organic EL device.

As long as the above-described DOS overlap rate parameter and the corresponding numerical values are satisfied, the exciton confinement layer 51 according to the present invention is not particularly limited in terms of a detailed configuration of the compound forming the exciton confinement layer 51, e.g., the kind of moieties included in the compound (e.g., an electron donor group (EDG) group and an electron withdrawing group (EWG) group) and its bonding site, a linking position of a linker, a composition thereof, and the like.

In an embodiment, the compound included as a material of the exciton confinement layer 51 may be a bipolar compound including a moiety having EWG characteristics with high electron withdrawing properties as well as a moiety having EDG characteristics with high electron donating properties.

In an embodiment, the compound included as a material of the exciton confinement layer 51 may be a conventional compound, known in the art, in which at least two moieties having EWG characteristics with high electron absorptivity are bonded.

More specifically, the compound (material) forming the exciton confinement layer 51 may include at least one EWG moiety of a 6-membered moiety represented by the following Formula 1; a 5-membered moiety represented by the following Formula 2; and a polycyclic moiety in which the 6-membered moiety and the 5-membered moiety are condensed.

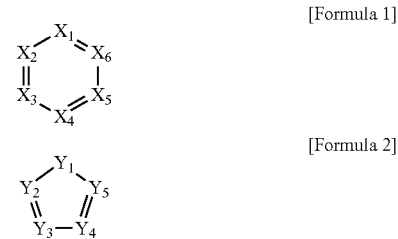

In Formula 1 or 2, $X_1$ to $X_6$ and $Y_1$ to $Y_5$ may be the same as or different from each other, each independently being N or C(R), while at least one of $X_1$ to $X_6$ and $Y_1$ to $Y_5$ is N, when C(R) is plural in number, the plurality of R may be the same as or different from each other, each independently being selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, or may be bonded with an adjacent group to form a condensed ring, the alkyl group, the alkenyl group, the alkynyl group, the aryl group, the heteroaryl group, the aryloxy group, the alkyloxy group, the cycloalkyl group, the heterocycloalkyl group, the arylamine group, the alkylsilyl group, the alkylboron group, the arylboron group, the arylphosphine group, the arylphosphine oxide group, and the arylamine group of R may each independently be substituted or unsubstituted with one or more kinds of substituents selected from the group consisting of hydrogen, deuterium (D), halogen, a cyano group, a nitro group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents may be the same as or different from each other.

The compound (material) forming the exciton confinement layer 51 exhibits excellent electronic properties by including at least one nitrogen(N)-containing heteroaromatic ring, and specifically, two or three nitrogen(N)-containing heteroaromatic ring, as an EWG. Accordingly, when the compound having the 6-membered or 5-membered moiety represented by Chemical Formulas 1 and 2, or when a polycyclic moiety in which they are condensed is used as a material of the exciton confinement layer 51, the driving voltage of the device 100 may be lowered and high efficiency and long life characteristics may be induced.

According to an embodiment of the present invention, the EWG moiety included in the compound forming the exciton confinement layer 51 may be embodied as one selected from the following structural group. However, it is not particularly limited thereto.

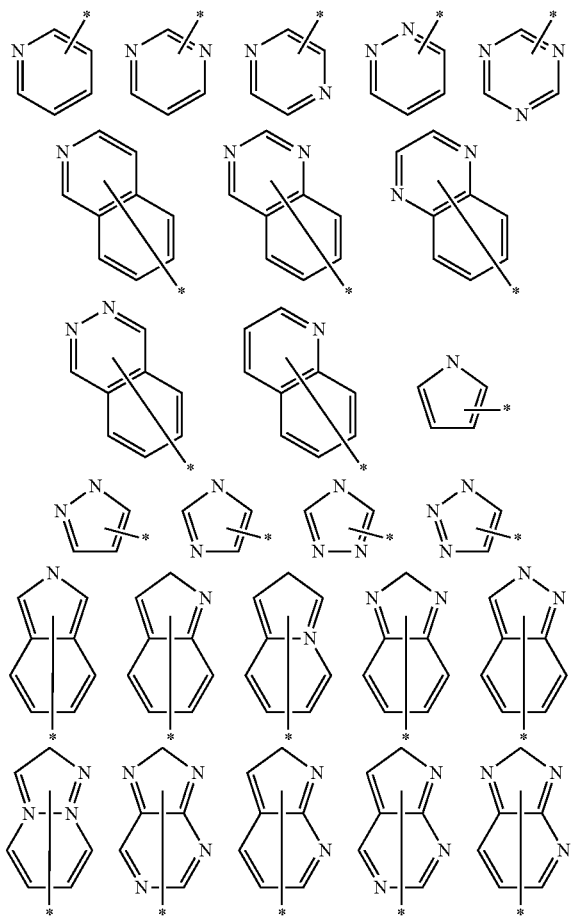

In the above formula,
* means a site where a bond is made with a compound that forms an exciton confinement layer.

Although not specifically indicated in the above structural formula, at least one or more substituents (e.g., the same as the definition of R) known in the art may be substituted. In addition, although one site * connected to the compound forming the exciton confinement layer is shown in the structural formula, it will be understood that a case where two sites are included is within the scope of the present invention.

In an embodiment according to the present invention, the compound forming the exciton confinement layer 51 may include at least one conventional EDG known in the pertinent art that has higher electron donating properties than that of the EWG.

The compound that may be used as the material forming the exciton confinement layer 51 of the present invention may be further embodied as exemplary compounds described below. However, the compound forming the exciton confinement layer 51 according to the present invention is not limited by those illustrated below. In particular, as long as the physical properties such as DOS overlap rate is satisfied, the type of moieties (e.g., EDG group and EWG group) included in the compound, its binding site, and the linking position of the linker are not particularly limited, and the compound with various modified structures are also within the scope of the present invention.

The exciton confinement layer 51 according to the present invention may be formed using any conventional method known in the art without particular limitation, for example, a vacuum deposition method, a spin coating method, a cast method, a Langmuir-Blodgett (LB) method, an inkjet printing method, a laser printing method, a laser-induced thermal imaging (LITI) method, and the like.

In the electron transporting area 50 according to the present invention, the electron injection layer 52 may use, without limitation, an electron injection material that is easy to inject electrons and has high electron mobility. Non-limiting examples of usable electron injecting materials include the bipolar compounds, anthracene derivatives, heteroaromatic compounds, alkali metal complex compounds and the like. Specifically, examples thereof may include lanthanum group metals such as LiF, $Li_2O$, BaO, NaCl, CsF, Yb and the like; or a metal halide such as RbCl, RbI, or the like, which may be used solely or in combination of two or more thereof.

The electron transporting area 50 according to the present invention, specifically, the electron injection layer 52 may be co-deposited with an n-type dopant to facilitate the injection of electrons from the cathode. In this case, the n-type dopant may use, without limitation, an alkali metal complex compound known in the art, and examples thereof may include alkali metal, alkaline earth metal or rare earth metal.

The electron transporting area 50 may be manufactured through conventional methods known in the art. Examples thereof may include a vacuum deposition method, spin coating method, cast method, LB (Langmuir-Blodgett), inkjet printing method, laser printing method, Laser Induced Thermal Imaging (LITI) and the like, but are not limited thereto.

Auxiliary Emissive Layer

Optionally, the organic electroluminescent device 100 according to the present invention may further include an auxiliary emissive layer (not illustrated) disposed between the hole transporting area 30 and the emissive layer 40.

The auxiliary emissive layer serves to transport holes moving from the hole transporting area 30 to the emissive layer 40 and to control a thickness of the organic material layer A. The auxiliary emissive layer has a high LUMO value to prevent electrons from moving to the hole transporting layer 32 and has a high triplet energy to prevent the excitons of the emissive layer 40 from diffusing into the hole transporting layer 32.

The auxiliary emissive layer may include a hole transporting material and may include a material the same as a material of the hole transporting area. In addition, the auxiliary emissive layers of the red, green, and blue organic electroluminescent devices may be formed of the same material.

The material of the auxiliary emissive layer is not particularly limited, and examples thereof may include carbazole derivatives and arylamine derivatives. Non-limiting examples of the auxiliary emissive layers that is applicable may include NPD(N, N-dinaphthyl-N, N'-diphenyl benzidine), TPD(N, N'-bis-(3-methylphenyl)-N, N'-bis(phenyl)-benzidine), s-TAD, and MTDATA(4,4',4-Tris(N-3-methylphenyl-Nphenyl-amino)-triphenylamine). They may be used solely or in combination of two or more thereof. In addition, the auxiliary emissive layer may include a p-type dopant, in addition to the above materials. As the p-type dopant, a well-known p-type dopant used in the art may be used.

Capping Layer

Optionally, the organic EL device 100 of the present invention may further include a capping layer (not illustrated) disposed on the cathode 20 described above. The capping layer serves to protect the organic EL device and to help light emitted from the organic material layer to be efficiently emitted to the outside.

The capping layer may include at least one selected from the group consisting of tris-8-hydroxyquinoline aluminum (Alq$_3$), ZnSe, 2,5-bis(6'-(2',2"-bipyridyl))-1,1-dimethyl-3,4-diphenylsilole, 4'-bis[N-(1-napthyl)-N-phenyl-amion]biphenyl ($\alpha$-NPD), N,N'-diphenyl-N,N'-bis (3-methylphenyl)-1,1'-biphenyl-4,4'-diamine (TPD), and 1,1'-bis(di-4-tolylaminophenyl) cyclohexane (TAPC). A material forming such a capping layer is less expensive than materials of other layers of the organic EL device.

The capping layer may be a single layer, or may include two or more layers having different refractive indices so that the refractive index gradually changes along the two or more layers.

The capping layer may be manufactured by a conventional method known in the art, and for example, various methods such as vacuum deposition, spin coating, casting, or Langmuir-Blodgett (LB) method may be used.

The organic EL device of the present invention including the above-described configuration may be manufactured according to conventional methods known in the art. For example, the organic EL device may be manufactured by vacuum depositing an anode material on a substrate and then vacuum depositing a material of the hole transporting area, a material of the emissive layer, a material of the electron transporting area, and a material of the cathode on the anode in this order.

FIG. 2 is a cross-sectional view illustrating a structure of an organic EL device according to another embodiment of the present invention. In FIG. 2, the same reference numerals as used in FIG. 1 denote the same members.

Hereinafter, the description of FIG. 2 will not be repeated with reference to FIG. 1, and only the differences will be described. Referring to FIG. 2, an organic EL device 200 according to a second embodiment of the present invention includes an electron transporting area 50 including an exciton confinement layer 51, an electron transporting layer 53, and an electron injection layer 52, which is dissimilar to the embodiment of FIG. 1 in which the electron transporting area 50 adjacent to the emissive layer 40 includes the exciton confinement layer 51 and the electron injection layer 52.

Specifically, the electron transporting area 50 of FIG. 2 is disposed between the emissive layer 40 and the cathode 20, and has a structure in which the exciton confinement layer 51, the electron transporting layer 53, and the electron injection layer 52 are disposed with respect to the emissive layer 40. If necessary, an auxiliary electron transporting layer (not illustrated) may be further included.

The electron transporting layer 53 is disposed between the exciton confinement layer 51 and the electron injection layer 52, and in such a case, the exciton confinement layer 51 may have a DOS that overlaps more than 0% of that of at least one of a host material of the emissive layer 40 and a material of the electron transporting layer 53, which are two layers adjacent thereto. The effect of the DOS overlap rate parameter and its numerical adjustment may be applied in the same manner as in the first embodiment.

The electron transporting layer 53 may use any material having conventional electron transporting properties known in the art without limitation. As an example, an oxadiazole derivative, a triazole derivative, a phenanthroline derivative (e.g., BCP), or a heterocyclic derivative including nitrogen may be included.

The electron transporting layer 53 according to the present invention may be co-deposited with a n-type dopant to facilitate the injection of electrons from the cathode. In this case, an alkali metal complex compound known in the art may be used without limitation as the n-type dopant, and examples thereof may include an alkali metal, an alkaline earth metal or a rare earth metal.

The electron transporting layer 53 may be formed by, but are not limited to, a vacuum deposition method, a spin coating method, a cast method, a Langmuir-Blodgett (LB) method, an inkjet printing method, a laser printing method, a laser-induced thermal imaging (LITI) method, and the like.

In addition, since the description of the material, structure, and the like of each element in the embodiment of FIG. 2 may be entirely applied to the description of the organic EL device 100 according to the first embodiment of FIG. 1, description thereof will be omitted.

The organic EL devices 100 and 200 according to the present invention described above have a structure in which the anode 10, the organic material layer A and A', and the cathode 20 are sequentially stacked, and an insulating layer or an adhesive layer may be further included between the anode 10 and the organic material layer A and A' or between the cathode 20 and the organic material layer A and A'. Such an organic EL device of the present invention may have excellent lifespan characteristics since the lifetime (e.g., half-time) of the initial brightness is increased while maintaining the maximum luminous efficiency when voltage, current, or both are applied.

Hereinafter, the present invention will be described in detail with reference to embodiments, but the following embodiments are merely illustrative of the present invention, and the present invention is not limited by the following embodiments.

Preparation Example

The compounds according to the present invention were prepared as follows, and their physical properties were measured by methods known in the art, respectively, and are shown in Table 1 below.

In such a case, a HOMO energy, a LUMO energy, a singlet energy S1, a triplet energy T1 of each compound may be determined by optical measurement of a thin film or a solution of the material but may also be determined by a quantum calculation scheme. In particular, the density of states (DOS) may be calculated through calculation of quantum mechanics (QM) and molecular dynamics (MD).

The HOMO energy, the LUMO energy, the singlet energy S1, the triplet energy T1 and the like of the material used in the present invention was calculated using a Schrödinger program (Schrödinger software release 2019-3), and the calculation scheme is as follows.

Specifically, the basic calculation scheme of each property used the B3LYP functional (Becke, 3-parameter, Lee-Yang-Parr) which is most widely used among density functional theories (DFT), and triple zeta (TZV) was used as a basis set to optimize the molecular structure.

The HOMO energy and the LUMO energy of each compound were calculated in the ground state S0 with the optimized structure, and the singlet energy S1 and the triplet energy T1 were calculated based on the optimized energy difference between S0/singlet S1 and S0/triplet T1, respectively.

In addition, the density of states (DOS) was obtained by performing a deposition simulation of thousands of atoms or more, and then extracting the LUMO energy using the quantum calculation once again, thus obtaining the DOS. Under conditions similar to the experiment through deposition, the DOS distribution differences between the host material and the exciton confinement layer were compared, and their DOS overlap rate was percentaged.

In addition, the bond-dissociation energy (BDE) was calculated using the B3LYP/TZV calculation scheme as described above, thus calculating the required energy to break a certain chemical bond present in the molecule, and a value with a smallest BDE was selected.

In order to maintain the same conditions of refractive index/electronic affinity/dipole moment/electron mobility, after the structure was optimized through a B3LYP/TZV scheme, which is the density functional theory, respective values were calculated using QM/MD, and in particular, the electron mobility was calculated using the Marcus theory which describes the movement of electrons. All results were calculated through the Schrödinger program.

In such a case, structures of respective compounds used in Examples 1 to 16 of the present invention is as follows.

TABLE 1

| Compound | Singlet energy (S1, eV) | Triplet energy (T1, eV) | LUMO$^{DOS}$ overlap rate (%) Host | LUMO$^{DOS}$ overlap rate (%) Electron transporting area | HOMO Energy (eV) | LUMO Energy (eV) | Refractive index (n) at 450 nm | BDE (eV) | Electronic affinity (eV) | Electron mobility (cm$^2$/Vs) | Dipole moment (Debye) |
|---|---|---|---|---|---|---|---|---|---|---|---|
| 1 | 3.84 | 2.41 | 60 | 3 | −6.16 | −1.94 | 2.01 | 2.67 | 1.05 | $1.5 \times 10^{-5}$ | 3.67 |
| 2 | 3.70 | 2.59 | 71 | 3 | −6.11 | −2.00 | 2.16 | 2.70 | 1.22 | $3.1 \times 10^{-5}$ | 7.10 |
| 3 | 3.66 | 2.58 | 61 | 22 | −6.30 | −2.17 | 2.01 | 2.7 | 1.50 | $8.4 \times 10^{-6}$ | 7.08 |
| 4 | 3.32 | 2.27 | 68 | 17 | −5.88 | −2.17 | 1.96 | 4.71 | 1.32 | $1.8 \times 10^{-7}$ | 3.17 |
| 5 | 3.68 | 2.42 | 67 | 2 | −6.06 | −2.01 | 2.08 | 2.70 | 1.22 | $7.4 \times 10^{-6}$ | 10.05 |
| 6 | 3.46 | 2.70 | 55 | 30 | −5.90 | −2.15 | 1.95 | 2.69 | 1.10 | $4.9 \times 10^{-7}$ | 1.23 |
| 7 | 3.56 | 2.89 | 15 | 70 | −6.10 | −2.24 | 2.04 | 2.67 | 1.13 | $6.2 \times 10^{-6}$ | 0.17 |
| 8 | 3.74 | 3.08 | 11 | 56 | −6.44 | −2.21 | 1.76 | 3.68 | 1.11 | $2.5 \times 10^{-6}$ | 0.21 |
| 9 | 3.75 | 2.93 | 12 | 64 | −6.46 | −2.22 | 1.91 | 3.69 | 1.12 | $9.7 \times 10^{-5}$ | 0.16 |
| 10 | 3.67 | 3.00 | 12 | 67 | −6.33 | −2.22 | 1.91 | 3.68 | 1.10 | $3.2 \times 10^{-6}$ | 0.25 |
| 11 | 3.68 | 3.08 | 13 | 64 | −6.34 | −2.23 | 1.84 | 3.67 | 1.08 | $5.8 \times 10^{-5}$ | 0.13 |
| 12 | 3.81 | 3.06 | 28 | 47 | −6.86 | −2.15 | 1.79 | 3.68 | 1.14 | $8.2 \times 10^{-7}$ | 0.27 |
| 13 | 2.18 | 1.63 | 58 | 12 | −5.63 | −2.99 | 0.72 | 1.53 | 0.89 | $4.9 \times 10^{-8}$ | 5.51 |
| 14 | 2.24 | 1.58 | 32 | 48 | −5.25 | −2.69 | 1.12 | 2.07 | 0.71 | $5.9 \times 10^{-6}$ | 4.98 |
| 15 | 2.12 | 1.52 | 74 | 11 | −5.05 | −2.10 | 0.81 | 1.73 | 0.97 | $6.5 \times 10^{-5}$ | 2.58 |
| 16 | 2.05 | 1.51 | 64 | 8 | −5.09 | −2.02 | 1.33 | 1.94 | 1.01 | $2.8 \times 10^{-8}$ | 6.67 |
| A | 3.07 | 2.48 | 0 | 0 | −6.05 | −2.25 | 1.72 | 2.32 | 1.66 | $3.6 \times 10^{-6}$ | 0.11 |
| Host (ADN) | 3.22 | 1.78 | — | — | −5.44 | −1.90 | | | | | |
| Electron transporting layer (TPBi) | 3.86 | 2.75 | — | — | −6.03 | −1.53 | | 3.05 | 0.65 | $1.8 \times 10^{-5}$ | 2.04 |

In such a case, structures of respective compound used in Embodiments 1 to 16 of the present invention are as follows.

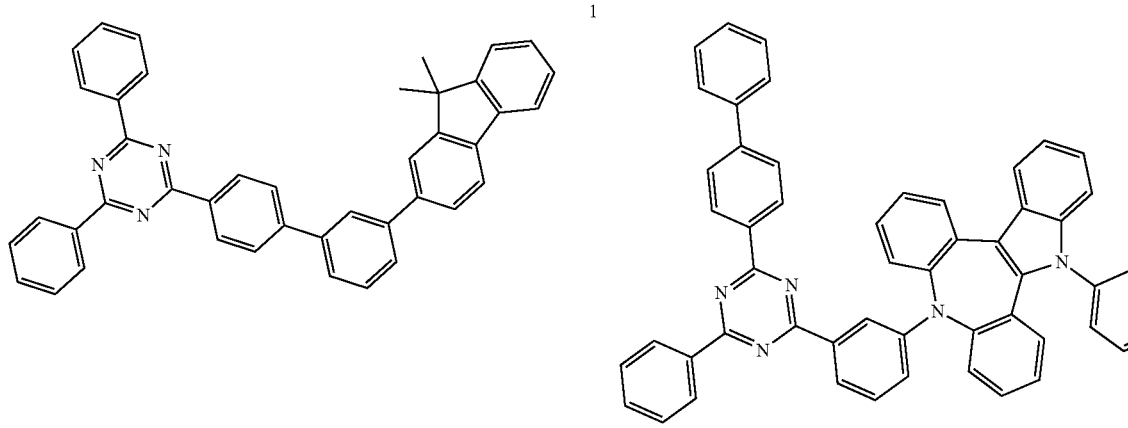

-continued
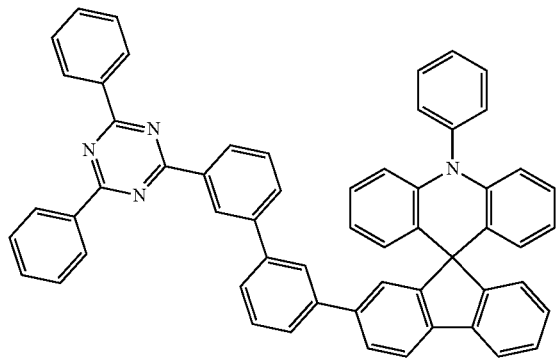
3
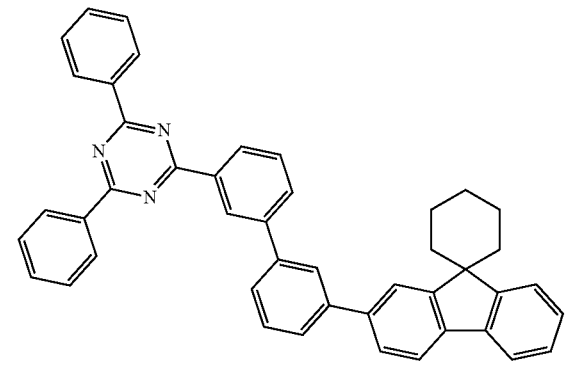
4
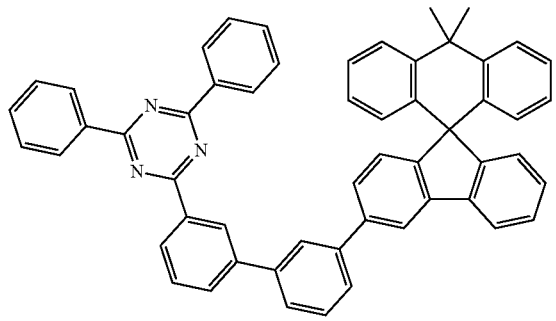
5
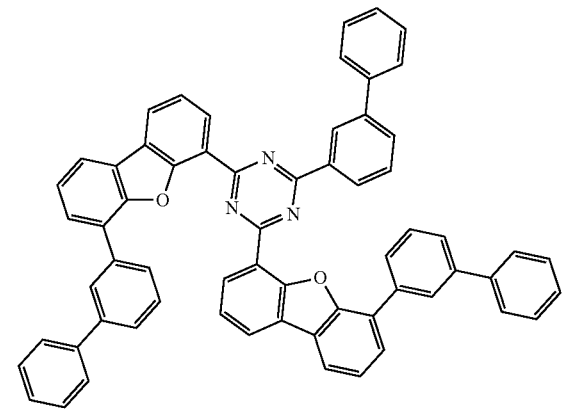
6
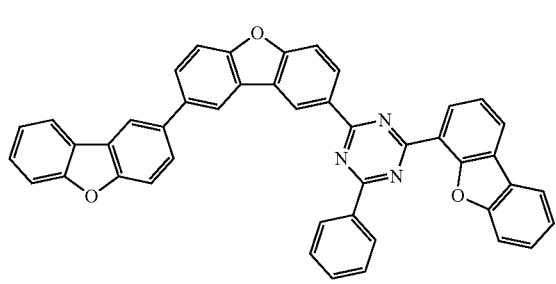
7
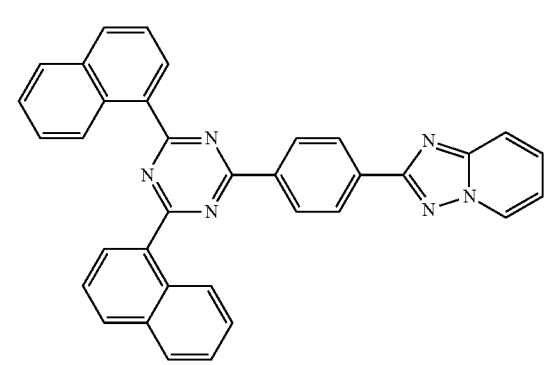
8
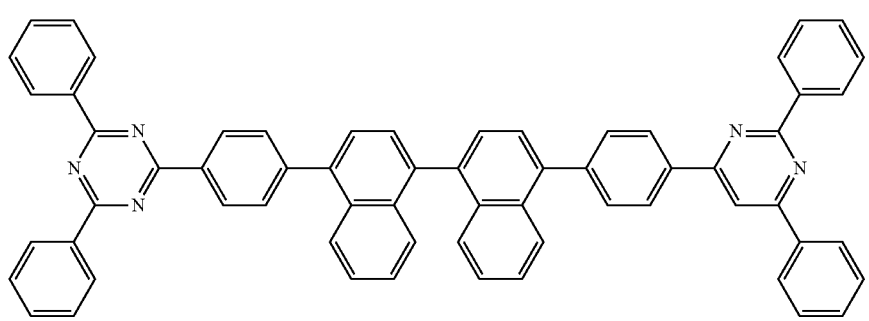
9

-continued
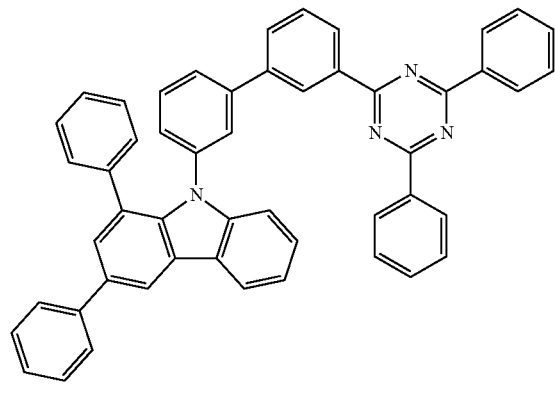
10
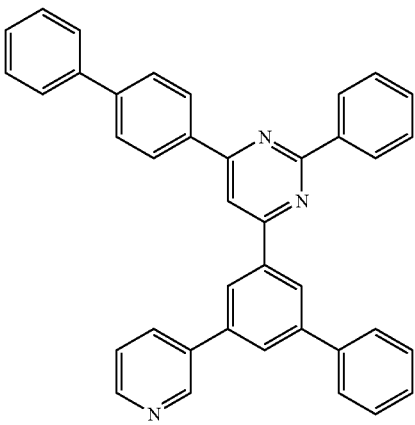
11
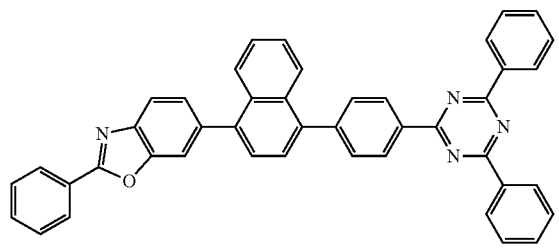
12
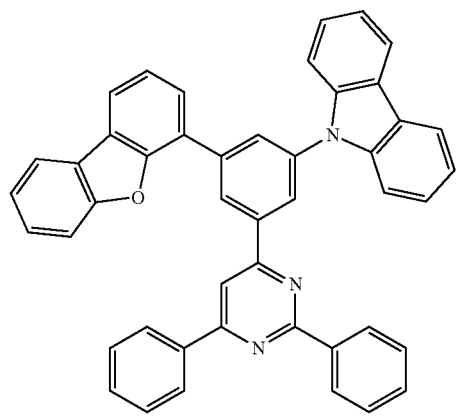
13
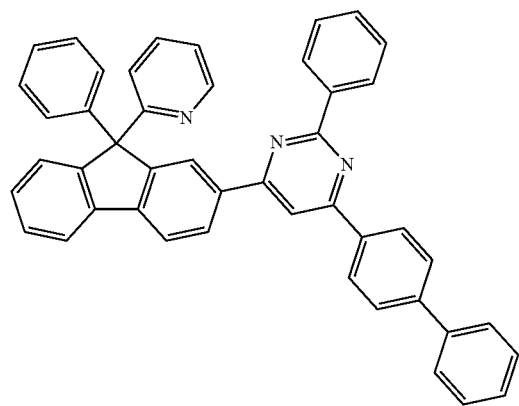
14
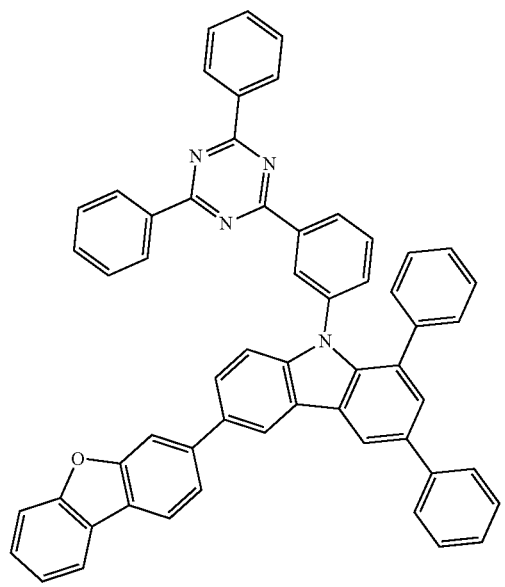
15

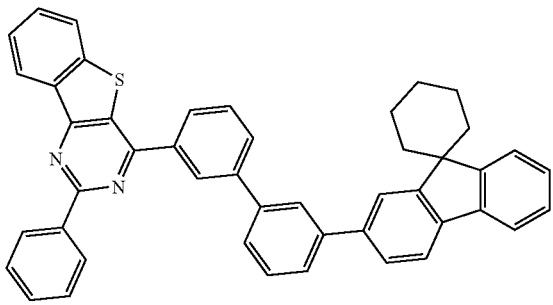

[Embodiments 1 to 16] Manufacturing of Blue Organic EL Device

After each compound was subjected to high purity sublimation purification by a conventionally known method, blue organic EL devices were manufactured as follows.

First, a glass substrate thin-film-coated with indium tin oxide (ITO) to a thickness of 1500 Å was washed with distilled water ultrasonically. After washing with distilled water was completed, the glass substrate was ultrasonically cleaned with a solvent, such as isopropyl alcohol, acetone and methanol, dried, transferred to a UV OZONE cleaner (Power sonic 405, Hwasin Tech) cleaned for 5 minutes using UV, and then transferred to a vacuum evaporator.

On the ITO transparent electrode prepared as above, DS-205 (Doosan Electronics CO., LTD., 80 nm)/NPB (15 nm)/ADN+5% DS-405 (Doosan Electronics CO., LTD., 30 nm)/respective Compounds of Table 2 (5 nm)/Alq$_3$ (25 nm)/LiF (1 nm)/Al (200 nm) were laminated in the order listed, thereby manufacturing organic EL devices.

TABLE 2

|  | Compound | Thickness (nm) |
| --- | --- | --- |
| Hole injection layer | DS-205 | 80 |
| Hole transporting layer | NPB | 15 |
| Emissive layer | ADN + 5% DS-405 | 30 |
| Exciton confinement layer | Respective Compounds 1~16 of Table 1 | 5 |
| Electron transporting layer (second layer) | TPBi | 25 |
| Electron injection layer | LiF | 1 |
| Cathode | Al | 200 |

[Comparative Example 1] Manufacturing of Blue Organic EL Device

A blue organic EL device of Comparative Example 1 was manufactured in the same manner as in Embodiment 1, except that Compound A was used instead of each compound in Table 1 that is used as an exciton confinement material.

For reference, structures of NPB, ADN, TPBi, and Compound A used in Embodiments 1 to 16 and Comparative Example 1 are as follows.

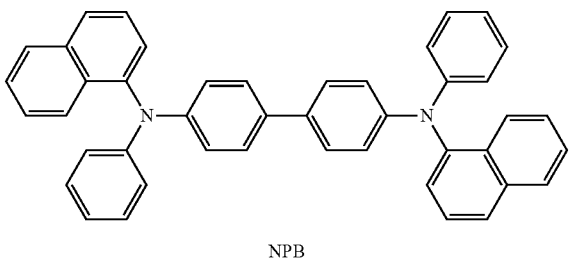

NPB

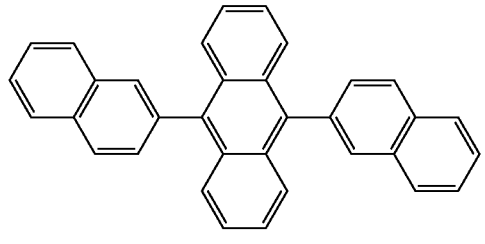

ADN

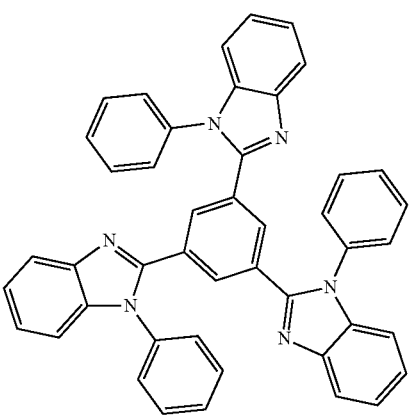

TPBi

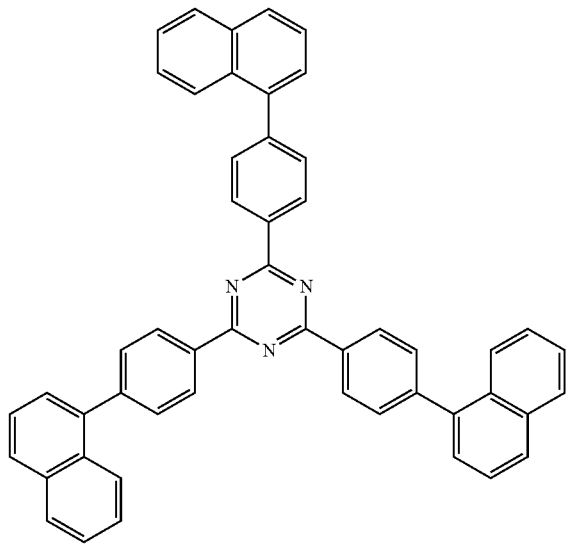

Compound A

Evaluation Example 1

For each of the blue organic EL devices manufactured in Embodiments 1 to 16 and Comparative Example 1, a driving voltage and a current efficiency at a current density of 10 mA/cm² were measured and the results are shown in Table 3 below.

TABLE 3

| Sample | Driving voltage (V) | Current efficiency (cd/A) |
|---|---|---|
| Embodiment 1 | 3.81 | 7.6 |
| Embodiment 2 | 3.83 | 7.5 |
| Embodiment 3 | 3.85 | 7.6 |
| Embodiment 4 | 3.71 | 7.9 |
| Embodiment 5 | 3.79 | 8.4 |
| Embodiment 6 | 3.88 | 7.4 |
| Embodiment 7 | 3.77 | 8.0 |
| Embodiment 8 | 3.78 | 7.6 |
| Embodiment 9 | 3.73 | 7.7 |
| Embodiment 10 | 3.77 | 7.8 |
| Embodiment 11 | 3.77 | 7.5 |
| Embodiment 12 | 3.70 | 8.1 |
| Embodiment 13 | 4.04 | 6.8 |
| Embodiment 14 | 3.78 | 7.2 |
| Embodiment 15 | 3.94 | 7.0 |
| Embodiment 16 | 3.82 | 7.3 |
| Comparative example 1 | 4.51 | 5.8 |

As shown in Table 3, it was appreciated that the blue organic EL devices of Embodiments 1 to 16 that include, between the emissive layer and the electron transporting layer, the exciton confinement layer in which a predetermined physical property is adjusted exhibited excellent performance in terms of the current efficiency and driving voltage, as compared with the blue organic EL device of Comparative Example 1 that does not include such an exciton confinement layer.

[Embodiments 17 to 32] Manufacturing of Blue Organic EL Device

After each compound was subjected to high purity sublimation purification by a conventionally known method, blue organic EL devices were manufactured as follows.

First, a glass substrate thin-film-coated with indium tin oxide (ITO) to a thickness of 1500 Å was washed with distilled water ultrasonically. After washing with distilled water was completed, the glass substrate was ultrasonically cleaned with a solvent, such as isopropyl alcohol, acetone and methanol, dried, transferred to a UV OZONE cleaner (Power sonic 405, Hwasin Tech) cleaned for 5 minutes using UV, and then transferred to a vacuum evaporator.

On the ITO transparent electrode prepared as above, DS-205 (Doosan Electronics CO., LTD., 80 nm)/NPB (15 nm)/ADN+5% DS-405 (Doosan Electronics CO., LTD., 30 nm)/respective Compounds of Table 4 (30 nm)/LiF (1 nm)/Al (200 nm) were laminated in the order listed, thereby manufacturing organic EL devices.

TABLE 4

| | Compound | Thickness (nm) |
|---|---|---|
| Hole injection layer | DS-205 | 80 |
| Hole transporting layer | NPB | 15 |
| Emissive layer | ADN + 5% DS-405 | 30 |
| Exciton confinement layer | Respective compounds of Table 1 | 30 |
| Electron injection layer | LiF | 1 |
| Cathode | Al | 200 |

[Comparative Example 2] Manufacturing of Blue Organic EL Device

A blue organic EL device of Comparative Example 1 was manufactured in the same manner as in Embodiment 17, except that Compound TPBi was used as an exciton confinement material instead of each compound in Table 1.

Evaluation Example 2

For each of the blue organic EL devices manufactured in Embodiments 17 to 32 and Comparative Example 2, a driving voltage and a current efficiency at a current density of 10 mA/cm² were measured and the results are shown in Table 5 below.

TABLE 5

| Sample | Driving voltage (V) | Current efficiency (cd/A) |
|---|---|---|
| Embodiment 17 | 3.88 | 6.2 |
| Embodiment 18 | 3.79. | 6.7 |
| Embodiment 19 | 3.77 | 6.9 |
| Embodiment 20 | 3.77 | 6.7 |
| Embodiment 21 | 3.80 | 7.0 |
| Embodiment 22 | 3.74 | 6.6 |
| Embodiment 23 | 3.98 | 6.1 |
| Embodiment 24 | 4.05 | 6.6 |
| Embodiment 25 | 4.43 | 7.0 |
| Embodiment 26 | 4.46 | 6.8 |
| Embodiment 27 | 4.19 | 6.2 |
| Embodiment 28 | 4.37 | 7.0 |
| Embodiment 29 | 3.91 | 7.5 |
| Embodiment 30 | 4.35 | 7.3 |

TABLE 5-continued

| Sample | Driving voltage (V) | Current efficiency (cd/A) |
|---|---|---|
| Embodiment 31 | 3.81 | 7.5 |
| Embodiment 32 | 4.20 | 7.4 |
| Comparative example 2 | 5.32 | 5.2 |

As shown in Table 5, it was appreciated that the blue organic EL devices of Embodiments 17 to 32 that include the exciton confinement layer in an area of the electron transporting area in contact with the emissive layer exhibited excellent performance in terms of the current efficiency and driving voltage, as compared with the blue organic EL device of Comparative Example 2 that includes the conventional TPBi as the electron transporting layer material.

The invention claimed is:

1. An organic electroluminescent device, comprising:
an anode; a hole transporting area; an emissive layer; an electron transporting area, and a cathode, which are stacked in this order,
wherein the emissive layer includes a host,
wherein the electron transporting area includes a first layer and a second layer, and
wherein the first layer of the electron transporting area, which is in contact with the emissive layer, is an exciton confinement layer, and a density of states for LUMO ($DOS_{LUMO}^{ECL}$) of the exciton confinement layer satisfies at least one or more of the following conditions (i) and (ii):
(i) the density of states for LUMO ($DOS_{LUMO}^{ECL}$) of the exciton confinement layer having a DOS that overlaps more than 0% of a density of states for LUMO ($DOS_{LUMO}^{HOST}$) of the host; and
(ii) the density of states for LUMO ($DOS_{LUMO}^{ECL}$) of the exciton confinement layer having a DOS that overlaps more than 0% of a density of states for LUMO ($DOS_{LUMO}^{ET}$) of the second layer of the electron transporting area except the exciton confinement layer,
wherein the exciton confinement layer comprises at least one EWG moiety of a 6-membered moiety represented by the following Formula 1; a 5-membered moiety represented by the following Formula 2; or a polycyclic moiety in which the 6-membered moiety and the 5-membered moiety are condensed,

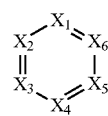
[Formula 1]

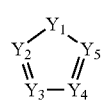
[Formula 2]

in Formula 1 or 2, $X_1$ to $X_6$ and $Y_1$ to $Y_5$ may be the same as or different from each other, each independently being N or C(R), while at least one of $X_1$ to $X_6$ and $Y_1$ to $Y_5$ is N,
when C(R) is plural in number, the plurality of R may be the same as or different from each other, each independently being selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, or may be bonded with an adjacent group to form a condensed ring,
the alkyl group, the alkenyl group, the alkynyl group, the aryl group, the heteroaryl group, the aryloxy group, the alkyloxy group, the cycloalkyl group, the heterocycloalkyl group, the arylamine group, the alkylsilyl group, the alkylboron group, the arylboron group, the arylphosphine group, the arylphosphine oxide group, and the arylamine group of R may each independently be substituted or unsubstituted with one or more kinds of sub stituents selected from the group consisting of hydrogen, deuterium (D), halogen, a cyano group, a nitro group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents may be the same as or different from each other.

2. The organic electroluminescent device of claim 1, wherein the second layer of the electron transporting area includes an electron transporting layer, an electron injection layer, or a combination thereof.

3. The organic electroluminescent device of claim 2, wherein the electron transporting area comprises:
(a) the exciton confinement layer and the electron injection layer; or
(b) the exciton confinement layer, the electron transporting layer, and the electron injection layer.

4. The organic electroluminescent device of claim 1, wherein a triplet energy ($T1_{ECL}$) of the exciton confinement layer is 1.5 eV or more.

5. The organic electroluminescent device of claim 1, wherein a singlet energy ($S1_{ECL}$) of the exciton confinement layer is 2.0 eV or more.

6. The organic electroluminescent device of claim 1, wherein an absolute value of HOMO of the exciton confinement layer is 5.0 eV or more.

7. The organic electroluminescent device of claim 1, wherein a band gap energy of the exciton confinement layer is 2.0 eV or more.

8. The organic electroluminescent device of claim 1, wherein the exciton confinement layer has a lowest energy level of bond-dissociation energy in a ground state of 1.50 eV or more.

9. The organic electroluminescent device of claim 1, wherein an absolute value difference (ΔLUMO) between a LUMO energy level of the exciton confinement layer and a LUMO energy level of the host is 2.0 eV or less.

10. The organic electroluminescent device of claim 1, wherein an absolute value difference (ΔLUMO) between a LUMO energy level of the exciton confinement layer and a LUMO energy level of the second layer of the electron transporting area that is adjacent to the exciton confinement layer is 2.0 eV or less.

11. The organic electroluminescent device of claim 1, wherein an absolute value difference (ΔHOMO) between a HOMO energy level of the exciton confinement layer and a HOMO energy level of the host is 2.0 eV or less.

12. The organic electroluminescent device of claim 1, wherein an absolute value difference (ΔHOMO) between a HOMO energy level of the exciton confinement layer and a HOMO energy level of the second layer of the electron transporting area that is adjacent to the exciton confinement layer is 2.0 eV or less.

13. The organic electroluminescent device of claim 1, wherein an electronic affinity (EA) of the exciton confinement layer is 0.5 eV or more.

14. The organic electroluminescent device of claim 1, wherein the exciton confinement layer has a refractive index (n) of 0.7 or more in a blue wavelength region ranging from 400 to 470 nm.

15. The organic electroluminescent device of claim 1, wherein a dipole moment of the exciton confinement layer is greater than zero.

16. The organic electroluminescent device of claim 1, wherein the exciton confinement layer has an electron mobility (μ) of at least $1\times10^{-8}$ $cm^2/Vs$ or more.

17. The organic electroluminescent device of claim 1, wherein the emissive layer includes a host and a dopant, and a mixing ratio of the host and dopant is 70-99.5:0.5-30 in a weight ratio.

18. The organic electroluminescent device of claim 1, comprising a plurality of emissive layer stacks including at least one emissive layer.

19. The organic electroluminescent device of claim 1, wherein the exciton confinement layer comprises a compound selected from the group consisting of compounds 1-16:

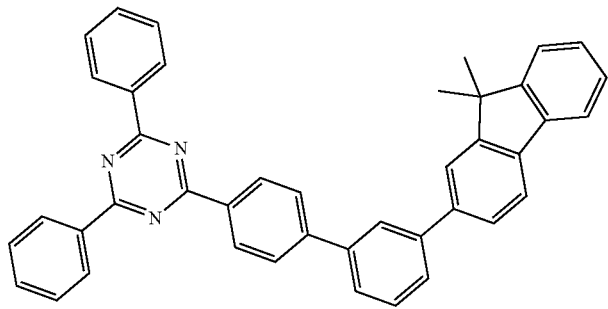

1

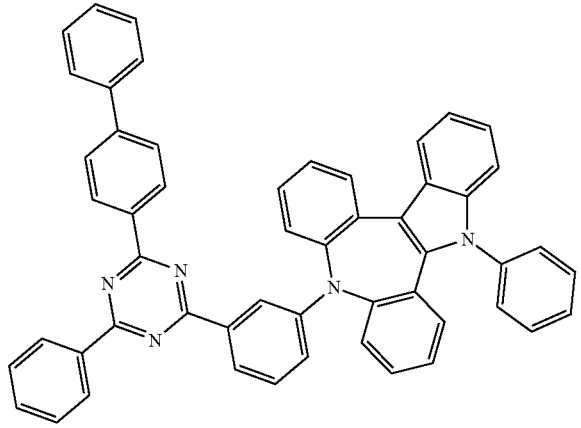

2

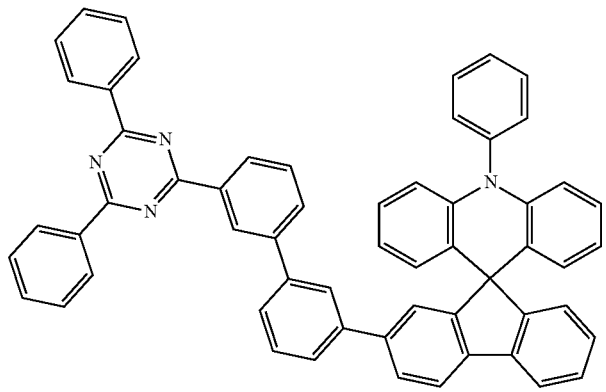

3

-continued
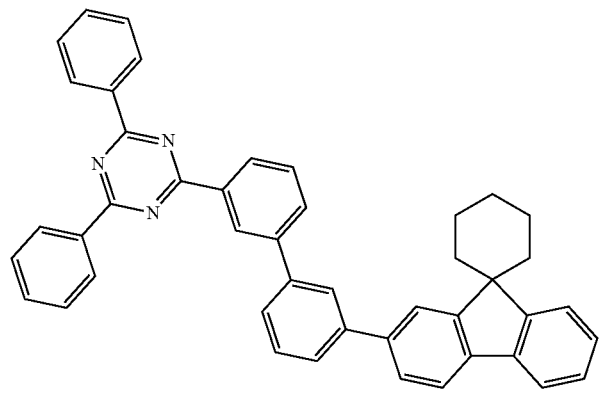
4
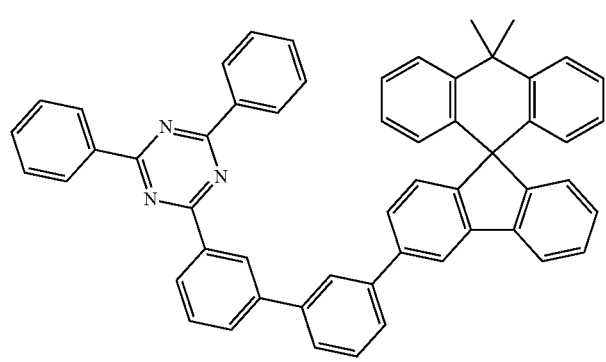
5
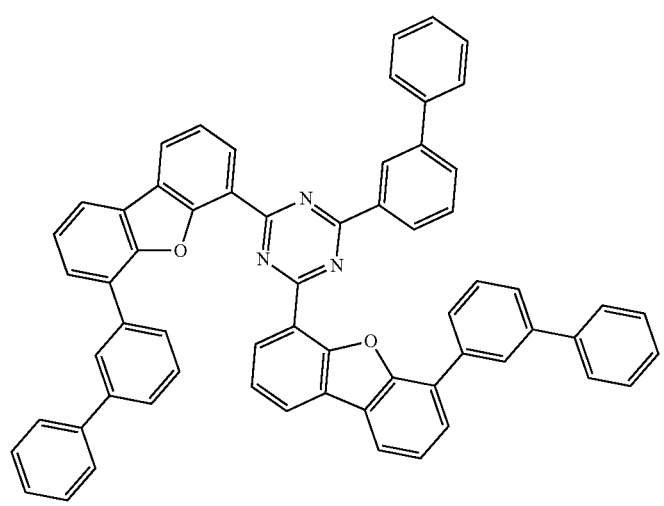
6
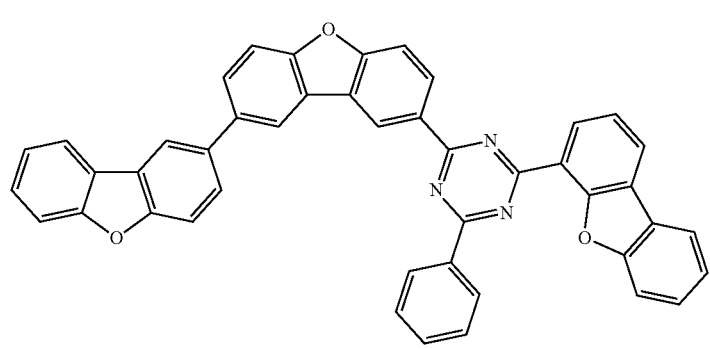
7

-continued
8
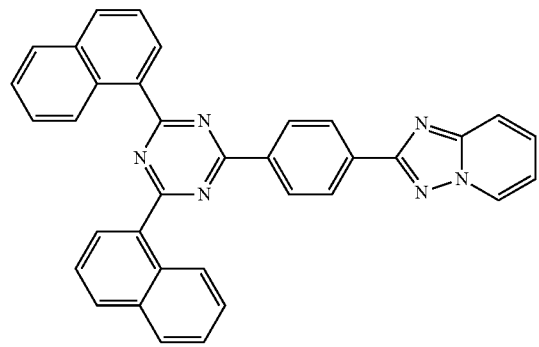
9
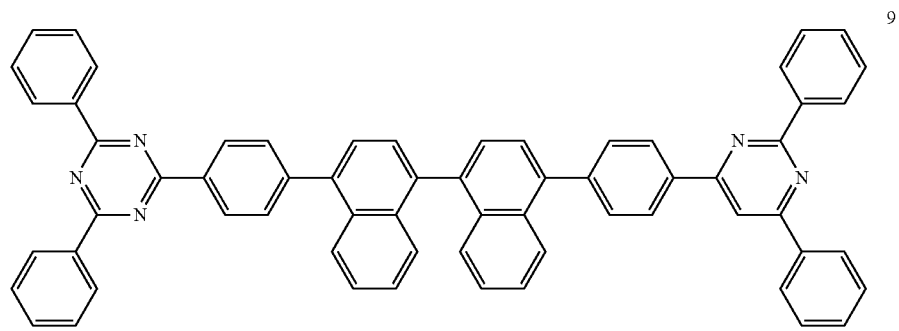
10
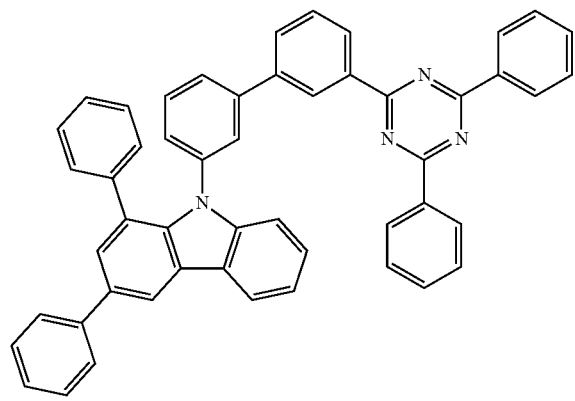
11
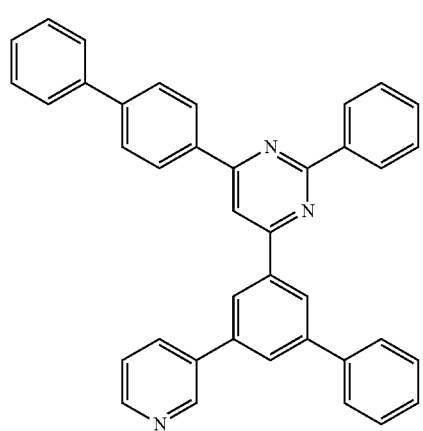

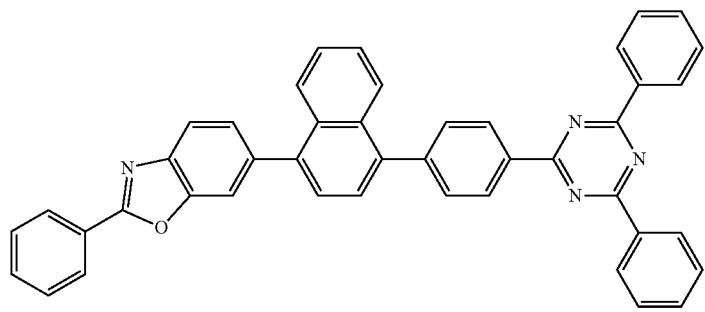
12
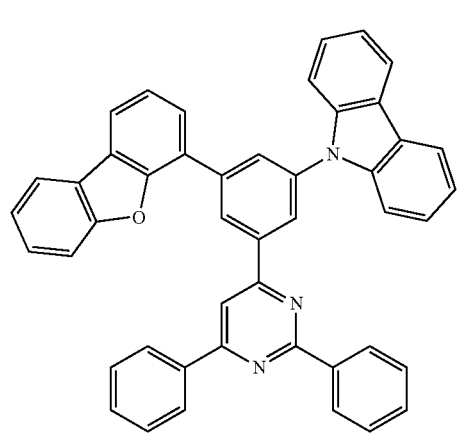
13
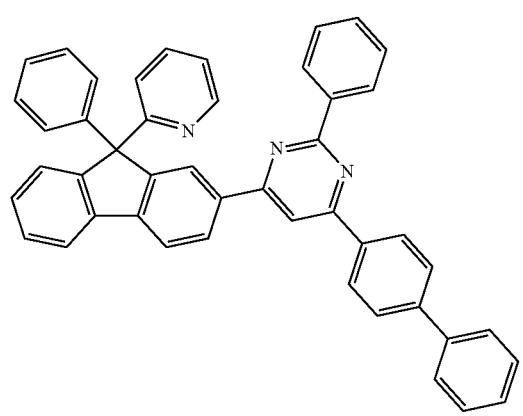
14

15
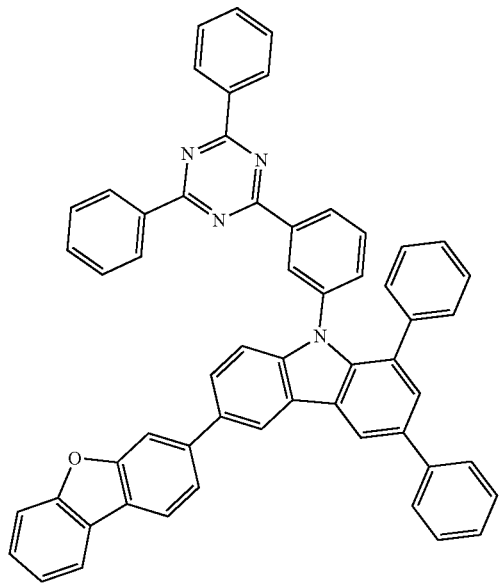
16
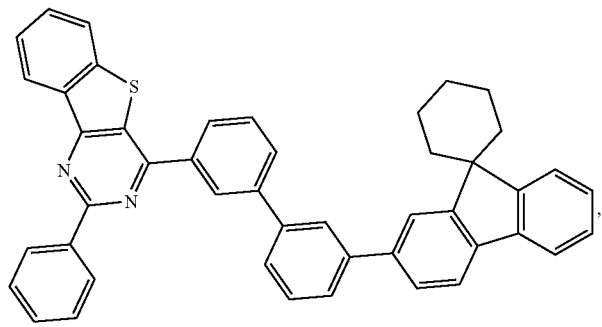
or a combination thereof.